United States Patent

[11] 3,600,698

[72] Inventors Willem Pieter Neidig; Petrus Johannes Joseph Termeer, both of Emmasingel, Eindhoven, Netherlands

[21] Appl. No. 3,592
[22] Filed Jan. 19, 1970
[45] Patented Aug. 17, 1971
[73] Assignee U.S. Philips Corporation New York, N.Y.
[32] Priority Jan. 23, 1969
[33] Netherlands
[31] 6901098

[54] AMPLIFIER PROVIDED WITH AUTOMATIC LEVEL CONTROL
4 Claims, 1 Drawing Fig.

[52] U.S. Cl. ........ 330/28, 330/29, 330/85
[51] Int. Cl. ........ H03g 3/30
[50] Field of Search ........ 330/28, 29, 85, 86; 325/319

[56] References Cited
UNITED STATES PATENTS
2,903,522 9/1959 Flower ........ 330/85 X

*Primary Examiner*—Roy Lake
*Assistant Examiner*—James B. Mullins
*Attorney*—Frank R. Trifari

ABSTRACT: A transistor amplifier supplied with automatic level control by means of an auxiliary transistor circuit connected in a negative feedback circuit between the amplifier output and input electrodes. The emitter of the auxiliary transistor and the amplifier output electrode are both connected to the same terminal of the DC supply. The output electrode is also connected to the base of the auxiliary transistor via a first resistor connected in parallel with the same combination of a diode and a second resistor. A capacitor is connected between a point of constant potential and the junction of the second resistor and the diode so as to produce a DC control voltage for said base electrode.

PATENTED AUG 17 1971
3,600,698
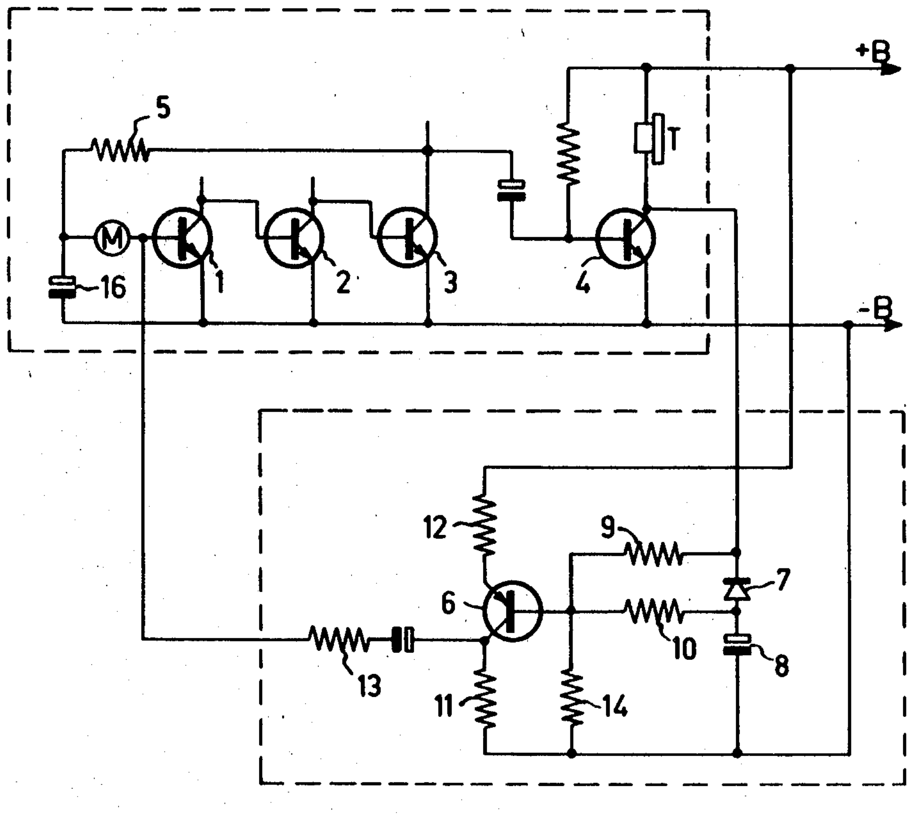
INVENTORS
WILLEM P. NEIDIG
PETRUS J. J. TERMEER
BY
Frank R. Trifari
AGENT

AMPLIFIER PROVIDED WITH AUTOMATIC LEVEL CONTROL

The invention relates to an amplifier provided with automatic level control by means of an auxiliary transistor connected in a negative feedback circuit between an output electrode and an input electrode of the amplifier and a rectifier coupled to this output electrode for producing a control direct voltage which is applied to the base of the auxiliary transistor.

Such amplifiers are used, for example, for amplifying low-frequency signals, such as microphone or pickup signals. The amplifier according to the invention is particularly suited for use in hearing aids. For this use the following requirements have to be satisfied: the use of the least possible number of circuit elements; a vigorous control as soon as the signal level exceeds a prescribed value in order to prevent the amplifier from being overdriven; a distortion in the transition range in which control sets in within permissible limits.

The invention relates to an amplifier which largely satisfies the said requirements, and is characterized in that the emitter of the auxiliary transistor is connected to that terminal of the supply source of the amplifier to which its output electrode is also connected through an output impedance and in that this output impedance is further connected to the base of the auxiliary transistor through the parallel connection of two circuits, one of these circuits including a first resistor and the other including the series connection of a second appreciably smaller resistor and the rectifier, while the connection between the second resistor and the rectifier is connected through a capacitor to a point of constant potential relative to the supply source.

The invention will now be described more fully with reference to the accompanying drawing, which shows an embodiment of the invention given by way of example.

The amplifier includes several cascade-connected transistors 1, 2, 3 and 4 by means of which the signal of a microphone M is converted into an amplified signal across a telephone T (for the sake of clarity the impedances through which the collectors of the transistors 1, 2 and 3 are connected to a supply terminal +B are not shown). The transistors shown are NPN junction transistors, but it will be appreciated that alternatively, for example, PNP junction transistors, field effect transistors or even tubes may be used for the purpose described. By means of a resistor 5 and an isolating capacitor 16, direct-current negative feedback and hence bias stabilization of the cascade transistors, 1, 2, 3 is obtained. The level control circuit includes a transistor 6, the base of which is connected to the collector of the transistor 4. The collector of the transistor 6 is connected to the base of the transistor 1, so that alternating current negative feedback for the amplifier 1–4 is obtained through the transistor 6. This negative feedback depends upon the level of the signal at the collector of the transistor 4 since there is produced, by means of a rectifier 7 and a capacitor 8, a control direct voltage which controls the setting of the transistor 6.

According to the invention the emitter of the transistor 6 is connected to the same terminal +B of the supply source as is the telephone T or, in general, the output impedance of the amplifier 1–4. Furthermore collector of the transistor 4 is connected through the parallel combination of two circuits, one including a resistor 9 and the other including the series connection of—in the order given — the said rectifier 7 and a resistor 10, to the base of the transistor 6. The junction point of the resistor 10 and the rectifier 7 is connected through the said capacitor 8 to a point of constant potential relative to the supply source. Thus, a direct-current path is formed from the terminal +B of the supply source through the emitter-base path of the transistor 6, the two parallel connected circuits 9 and 10, 7 to the collector of the transistor 4. The operation of this circuit configuration is as follows:

It is assumed that the supply voltage between the terminals +B and −B is, say, 1.3 volts and that the bias setting of the transistor 4 is such that a direct voltage of 1.1 volts relative to the terminal −B is set up at its collector. It is further assumed that the internal emitter-base threshold voltage to be exceeded for the transistor 6 to become conductive is 0.6 volt and the threshold voltage above which the rectifier 7 becomes conductive is 0.2 volt. If is further assumed that the resistor 9 (of, say, 150 kΩ) is large compared with the resistor 10 (of, say, 5 KΩ), for example, larger by a factor of from 20 to 60. Thus, as long as the alternating-voltage amplitude of the signal at the collector of the transistor 4 remains smaller than 0.4 volt the emitter threshold voltage of the transistor 6 will not be exceeded and hence this transistor will remain nonconductive. If, however, this signal amplitude becomes 0.7 volt, thereby exceeding 0.6 volt, with the result that the instantaneous voltage at the collector of the transistor 4 fluctuates between 0.4 volt and 1.8 volts relative to the terminal −B (owing to the appreciably inductive nature of the telephone T the alternating voltage at the collector of the transistor 4 may temporarily exceed the voltage at the terminal +B), the circuit comprising the emitter-base path of the transistor 6, the resistor 10 and the rectifier 7 will become conductive during the negative peaks of this alternating voltage, so that at the capacitor 8 there is produced a direct voltage which maintains the transistor 6 conductive. The negative-feedback current which in this event is returned from the collector of the transistor 6 to the base of the transistor 1 will counteract any further increase of the signal voltage at the collector of the transistor 4, so that a limitation of the level is obtained. In the transition range of the signal alternating voltage at the collector of the transistor 4 between 0.4 volt and 0.6 volt only a very slight signal distortion will occur because the signal alternating voltage at the base of the transistor 6 is only a few hundredths of a volt owing to the high ratio between the resistors 9 and 10. It should be borne in mind that the current-voltage characteristics of the transistor 6 and of the diode 7 show no abrupt changes so that at this small base alternating voltage the transistor 6 still will fairly behave as a linear amplifier. However, as soon as the diode 7 starts conducting the operating point of the transistor 6 is shifted to a degree such that there is substantially no distortion at all.

In order further to reduce this so-called take-over distortion, various steps may be taken, such as reducing the resistor 10, increasing the resistor 9 with a simultaneous increase of the collector resistor 11 of the transistor 6, using a resistor 12 in the emitter circuit of the transistor 6, using a resistor between the base of the transistor 6 and the terminal +B and/or between the junction point of the circuit elements 7, 3 and 10 and the terminal +B, which resistor also will be made larger, for example, several times larger, than the resistor 9.

By a suitable choice of the various circuit elements the slope of the control curve (by means of the resistors 9 or a resistor 13) or the level of the output voltage at which the control becomes operative (by means of the resistors 9 or 10) may readily be varied and/or the set-in and release time-constants (by means of T and capacitor 8 and by resistor 10 and capacitor 8, respectively) can be set at suitable values. In particular, when a comparatively small capacitor 8 (of, for example, 0.1 /uF) is used, it may be desirable for the release time constant to be increased, for which purpose a large resistor 14 may be connected between the base of the transistor 6 and the terminal −B.

What we claim is:

1. An amplifier provided with automatic level control comprising an auxiliary transistor connected in a negative-feedback circuit between an output electrode and an input electrode of the amplifier, a rectifier coupled to this output electrode for producing a control direct voltage which is applied to the base of the auxiliary transistor, means connecting the emitter of the auxiliary transistor to that terminal of the supply source of the amplifier to which its output electrode also is connected through an output impedance, means further connecting this output electrode to the base of the auxiliary transistor through the parallel combination of two circuits, one of these circuits including a first resistor and the other including the series combination of a second appreciably smaller resistor and said rectifier, and means connecting the junction between the second resistor and the rectifier through a capacitor to a point of constant potential relative to the supply source.

2. An amplifier as claimed in claim 1, characterized in that a resistor is included in the lead between the said terminal of the supply source and the emitter of the auxiliary transistor.

3. An amplifier as claimed in claim 1 characterized in that a resistor is connected between the base of the auxiliary transistor and the other terminal of the supply source.

4. An amplifier as claimed in claim 1 further comprising a second capacitor coupled between the collector of the auxiliary transistor and the input electrode of the amplifier.